US 6,746,899 B2

(12) United States Patent
Grigg

(10) Patent No.: US 6,746,899 B2
(45) Date of Patent: Jun. 8, 2004

(54) TAPE STIFFENER, SEMICONDUCTOR DEVICE COMPONENT ASSEMBLIES INCLUDING SAME, AND STEREOLITHOGRAPHIC METHODS FOR FABRICATING SAME

(75) Inventor: Ford B. Grigg, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/436,939

(22) Filed: May 13, 2003

(65) Prior Publication Data
US 2003/0176021 A1 Sep. 18, 2003

Related U.S. Application Data

(60) Continuation of application No. 09/903,241, filed on Jul. 11, 2001, now Pat. No. 6,562,661, which is a division of application No. 09/512,203, filed on Feb. 24, 2000.

(51) Int. Cl.[7] .................. H01L 21/44; H01L 21/48; H01L 21/50
(52) U.S. Cl. .................. 438/125; 438/126; 438/121; 264/401
(58) Field of Search ................. 438/125, 126, 438/121; 264/401

(56) References Cited

U.S. PATENT DOCUMENTS

| 4,865,193 | A | 9/1989 | Shimamoto et al. |
| 5,173,220 | A | 12/1992 | Reiff et al. |
| 5,264,061 | A | 11/1993 | Juskey et al. |
| 5,278,442 | A | 1/1994 | Prinz et al. |
| 5,397,921 | A | 3/1995 | Karnezos |
| 5,409,865 | A | 4/1995 | Karnezos |
| 5,484,314 | A | 1/1996 | Farnworth |
| 5,663,530 | A | 9/1997 | Schueller et al. |
| 5,705,117 | A | 1/1998 | O'Connor et al. |
| 5,834,338 | A | 11/1998 | Takeda et al. |
| 5,835,355 | A | 11/1998 | Dordi |
| 5,843,808 | A | 12/1998 | Karnezos |
| 5,844,168 | A | 12/1998 | Schueller et al. |
| 5,915,169 | A | 6/1999 | Heo |
| 6,002,169 | A | 12/1999 | Chia et al. |
| 6,020,221 | A | 2/2000 | Lim et al. |
| 6,025,641 | A | 2/2000 | Park |
| 6,057,174 | A | 5/2000 | Hashimoto |
| 6,380,620 | B1 | 4/2002 | Suminoe et al. |

FOREIGN PATENT DOCUMENTS

| JP | 11-186438 A | 7/1999 |
| JP | 2001-044248 A | 2/2002 |

Primary Examiner—David A. Zarneke
(74) Attorney, Agent, or Firm—TraskBritt

(57) ABSTRACT

Stiffeners for tapes, films, or other connective structures, which are configured to be secured to a semiconductor device component, such as a semiconductor die or substrate, by tape-automated bonding processes, are fabricated by stereolithographic processes and may include one or two or more layers. The stiffeners are configured to prevent torsional flexion or bending of the connective structure to which they are to be secured. The stiffeners may reinforce sprocket or indexing holes in connective structures. The stiffeners may include apertures through which intermediate conductive elements or other structures secured to the connective structure may be exposed or protrude. The stereolithographic method for fabricating stiffeners may include use of a machine vision system that recognizes the position and orientation of one or more connective structures on which at least an element of each of the stiffeners is to be fabricated so that the application of material thereto may be controlled 17 Claims, 8 Drawing Sheets

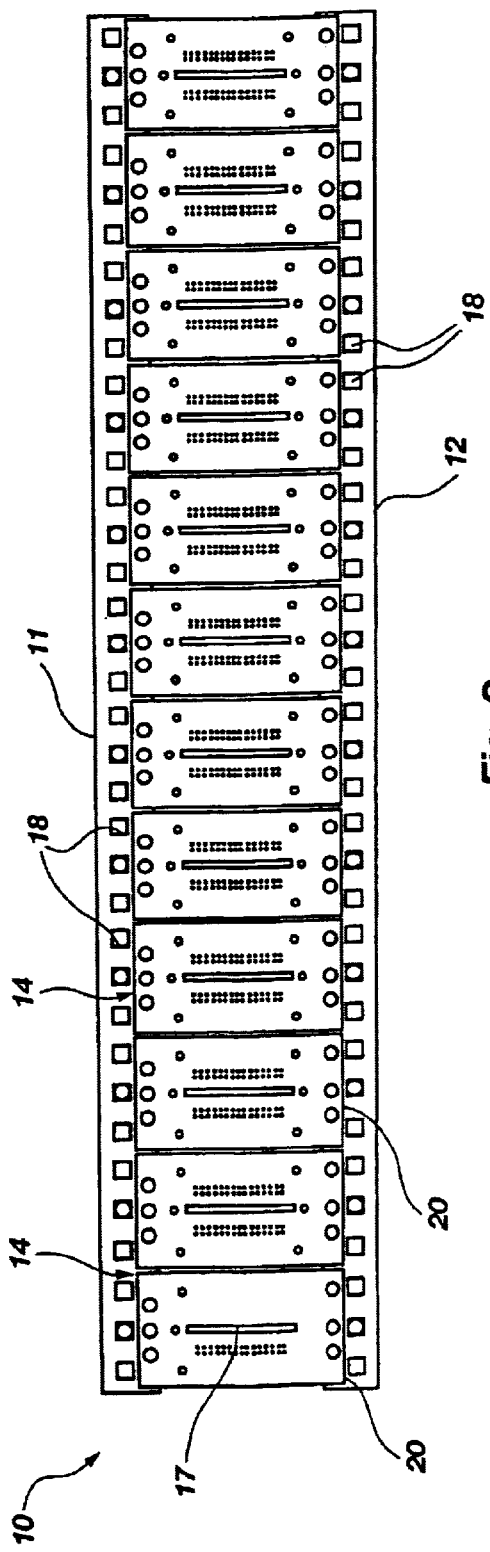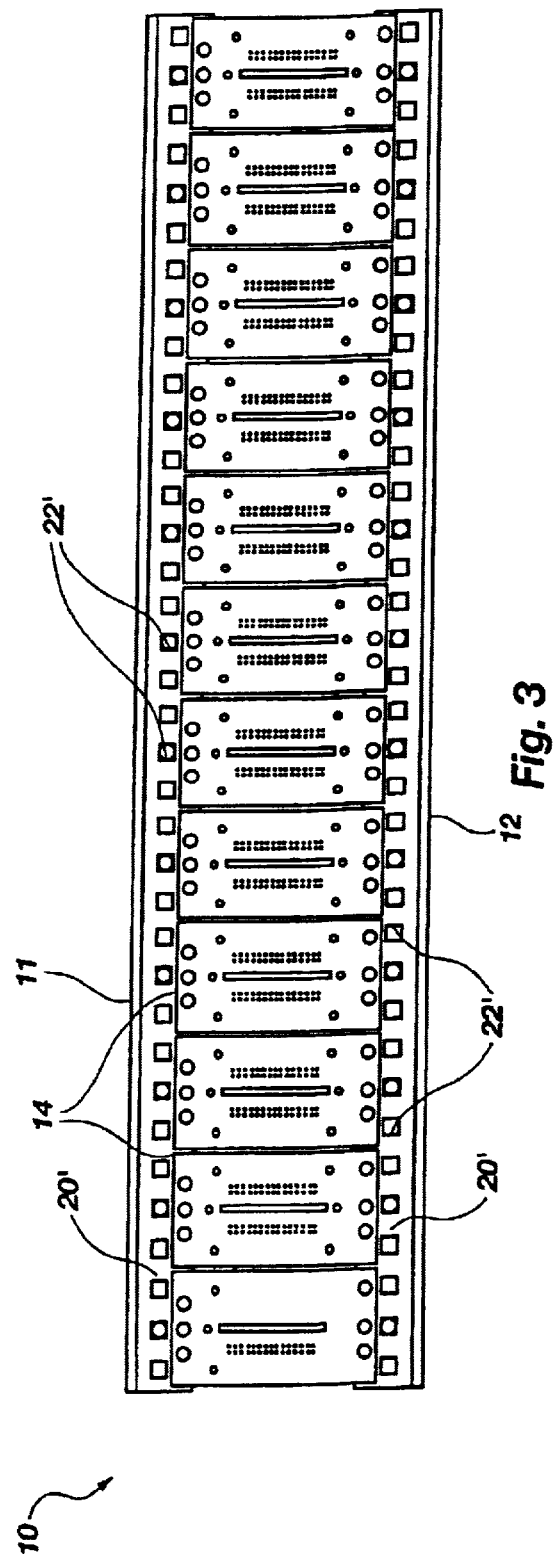

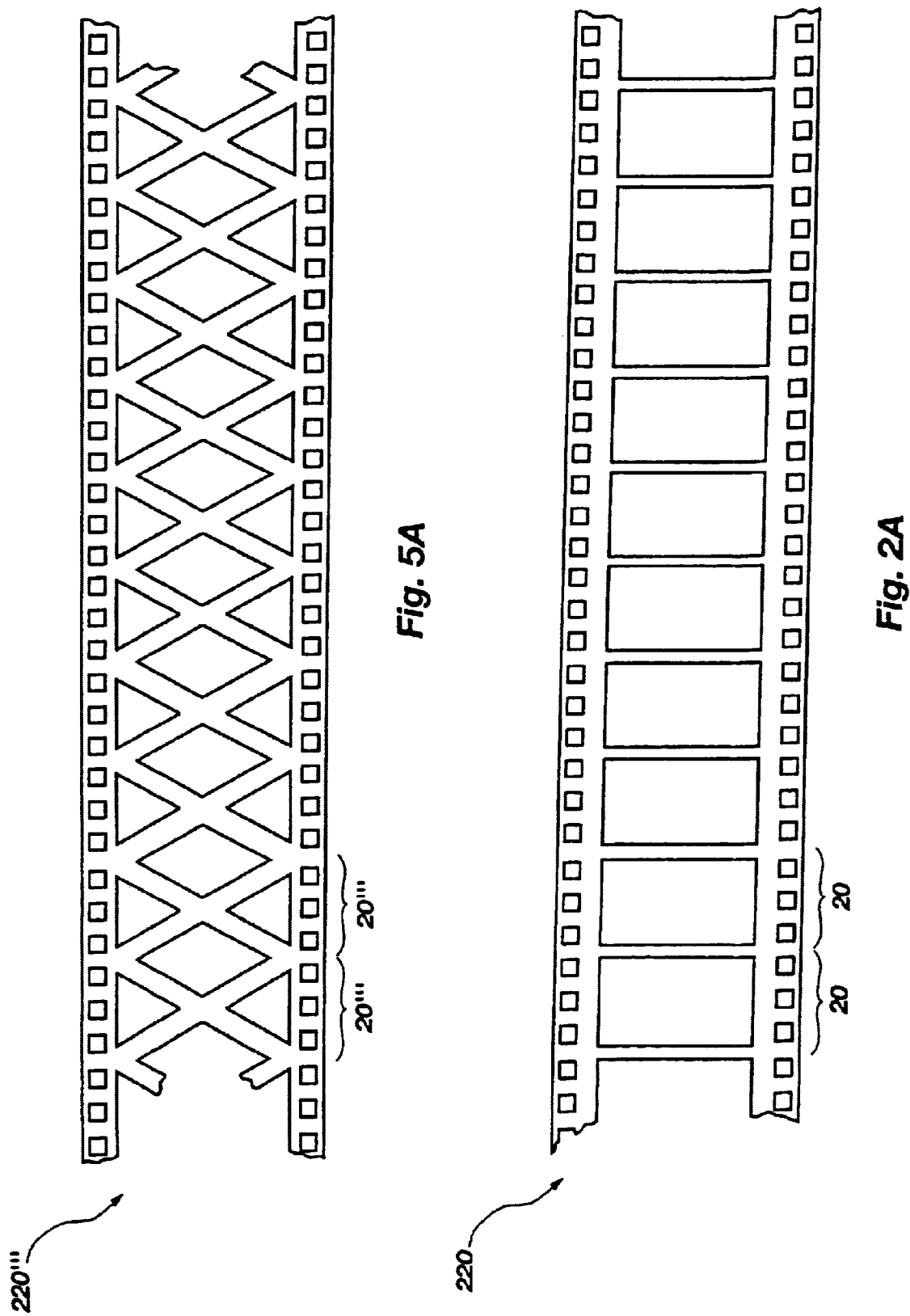

TAPE STIFFENER, SEMICONDUCTOR DEVICE COMPONENT ASSEMBLIES INCLUDING SAME, AND STEREOLITHOGRAPHIC METHODS FOR FABRICATING SAME

CROSS-REFERENCE TO RELATED APPLICATIONS

This application is a continuation of application Ser. No. 09/903,241, filed Jul. 11, 2001, now U.S. Pat. No. 6,562,661, issued May 13, 2003, which is a divisional of application Ser. No. 09/512,203, filed Feb. 24, 2000, pending.

BACKGROUND OF THE INVENTION

1. Field of the Invention

The present invention relates generally to tape structures that are used in assemblies of semiconductor device components, such as the flexible dielectric tapes that are used in tape automated bonding (TAB) and tape ball grid array (TOGA) packages. Particularly, the tapes of the present invention have stiffeners, or support structures, thereon. More specifically, the present invention relates to tapes with stereolithographically fabricated stiffeners. The present invention also relates to assemblies of semiconductor device components that include the tapes of the present invention and to stereolithographic methods for fabricating stiffeners on the tapes.

2. Background of Related Art

Tapes Used with Semiconductor Device Components

In some state of the art semiconductor devices, flexible dielectric tapes with electrical traces thereon are used to connect different semiconductor device components. As a first exemplary use of tapes in semiconductor devices, TAB employs flexible dielectric tapes with circuit traces thereon to electrically connect different semiconductor device components, such as dice and lead frames or circuit boards. In another example of the use of tape in semiconductor devices, a tape with circuit traces thereon may be used as an interposer in a TBGA package to reroute the outputs of a semiconductor device from the bond pad locations on a semiconductor die with which the tape is assembled to different contact pad locations on the tape to which conductive balls or bumps are mounted.

Tapes used in assemblies of semiconductor device components include a thin, flexible dielectric film with conductive traces and contact pads formed thereon. Typically, the dielectric films of such tapes are formed from polyimide or other suitable polymers. These films are usually only a few mils (e.g., 6 mils) thick to provide a desired amount of flexibility and to avoid a substantial increase in the overall thickness of an assembly of semiconductor device components that includes such an electrically connective tape. The conductive traces and contact pads on such films may be formed from a suitable conductive material, such as copper or aluminum.

Since these tapes are usually flexible, it is sometimes difficult to hold the tape in place to make the desired connections with a semiconductor device component. This is particularly true in TBGA packages, where torsional flexion and bending of the tape are undesirable during bonding of the contact pads of the tape to the bond pads of a semiconductor die. Bending of such tapes is also somewhat undesirable in TAB operations where a row of bond pads, other contact pads, or leads of a semiconductor device component are being bonded to an adjacent row of contact pads on the tape.

In response to these problems, thicker, less flexible tapes have been developed, as have tapes with heavier circuit traces that are positioned to counteract undesirable flexion or bending. Also, tapes that are to be used as interposers in TBGA packages are often supported by a rigid frame, such as a copper or aluminum frame, in order to prevent undesirable torsional flexion and bending of the tape during assembly with, and bonding to, one or more semiconductor dice. When the area of the TBGA interposer is relatively large compared to the area of the semiconductor die, these frames, or stiffeners, may remain in place on the tape so as to support the portions of the tape that extend laterally beyond the periphery of the semiconductor die. Stiffeners that remain in place with respect to the tape following connection of the tape to a semiconductor die are usually electrically isolated from the circuits of the TBGA package.

Exemplary TBGA tapes with metal stiffeners and packages including the same are disclosed in U.S. Pat. No. 6,002,169, issued to Chia et al. on Dec. 14, 1999; U.S. Pat. No. 5,844,168, issued to Schueller et al. on Dec. 1, 1998; U.S. Pat. No. 5,843,808, issued to Karnezos on Dec. 1, 1998; U.S. Pat. No. 5,663,530, issued to Schueller et al. on Sep. 2, 1997; U.S. Pat. No. 5,409,865, issued to Karnezos on Apr. 25, 1995; and U.S. Pat. No. 5,397,921, issued to Karnezos on Mar. 14, 1995.

As shown in FIG. 1, in the assembly of a carrier tape 14 to a semiconductor die to form a TBGA package, several TBGA tapes 14 are typically connected to one another in an elongate strip 10, similar to a roll of photographic film. A semiconductor die is connected on its active surface to each TBGA tape 14 of elongate strip 10. Prior to connecting a semiconductor die to the next, adjacent tape 14, strip 10 is moved laterally. Typically, strip 10 includes sprocket or indexing holes 18 near the top and bottom edges 11, 12 thereof to facilitate such lateral movement. Conventionally, the entire strip 10 of tapes 14 is carried on a metal (e.g. copper) stiffener or frame 1. Following connection of a semiconductor die to a TBGA tape 14, the semiconductor die-TBGA tape assembly, which forms a TBGA package, is severed from strip 10.

While conventional metal stiffeners provide support to a tape to be used in a TBGA package, they only support the tape for purposes of connection to the semiconductor die and portions of the tape that extend laterally beyond the periphery of the semiconductor die. Thus, other portions of the tape that are prone to flexing or damage during assembly of the tape with a semiconductor die, such as the sprocket or indexing holes of a strip of TBGA tapes, are not reinforced. Due to the relative thinness and delicacy of these portions of the tape, however, such reinforcement is desirable.

Stereolithography

In the past decade, a manufacturing technique termed "stereolithography," also known as "layered manufacturing," has evolved to a degree where it is employed in many industries.

Essentially, stereolithography as conventionally practiced involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a partially consolidated, or semisolid, state in those areas of a given layer corresponding to portions of the object, the consolidated or fixed material also at that time being substantially concurrently bonded to a lower layer of the object to be fabricated. The unconsolidated material employed to build an object may be supplied in particulate or liquid form, and the material itself may be consolidated or fixed, or a separate binder material may be employed to bond material particles to one another and to those of a previously formed layer. In some instances, thin sheets of material may be superimposed to build an object, each sheet being fixed to a next-lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, preexisting object or component to create a larger product.

However, to the inventor's knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results are required. In particular, the inventor is not aware of the use of stereolithography to fabricate stiffeners for tapes that are used to electrically connect semiconductor devices to other semiconductor device components, such as other semiconductor devices or substrates. Furthermore, conventional stereolithography apparatus and methods fail to address the difficulties of precisely locating and orienting a number of pre-existing components for stereolithographic application of material thereto without the use of mechanical alignment techniques or to otherwise assuring precise, repeatable placement of components.

SUMMARY OF THE INVENTION

The present invention includes stiffeners for use on tapes such as TBGA tapes and other tapes that may be suitable for use in TAB applications. The present invention also includes tapes with such stiffeners, as well as semiconductor devices and assemblies including tapes with such stiffeners.

The stiffeners of the present invention are preferably fabricated from a dielectric material, such as a dielectric photoimageable polymer. The stiffeners may have any configuration and are preferably shaped to prevent torsional flexion and bending of the tape. For example, a stiffener may be located adjacent substantially the periphery of a tape. Alternatively, a stiffener may include one or more elongate, straight or nonlinear elements that traverse the tape. As another alternative, a stiffener may include a sheet of material that laterally spreads across a portion of the area of the tape. Stiffeners configured as sheets may include apertures through which electrical traces or conductive elements extend to facilitate electrical connections through the tape.

The stiffeners of the present invention may also be configured to reinforce sprocket or indexing holes through the tape. For example, elongate stiffeners may be located at the top and bottom of a strip of tape, with sprocket or indexing holes being formed therethrough. Alternatively, rings may be formed around individual sprocket or indexing holes or around groups of sprocket or indexing holes to reinforce same.

According to another aspect, the present invention includes a method for fabricating the stiffeners. In a preferred embodiment of the method, a computer-controlled, 3-D CAD initiated process known as "stereolithography" or "layered manufacturing" is used to fabricate the stiffeners. When stereolithographic processes are employed, each stiffener is formed as either a single layer or a series of superimposed, contiguous, mutually adhered layers of material.

The stereolithographic method of fabricating the stiffeners of the present invention preferably includes the use of a machine vision system to locate tapes on which the stiffeners are to be fabricated, as well as the features or other components on or associated with the tapes (e.g., circuit traces, contact pads, etc.). The use of a machine vision system directs the alignment of a stereolithography system with each tape for material disposition purposes. Accordingly, the tape need not be precisely mechanically aligned with any component of the stereolithography system to practice the stereolithographic embodiment of the method of the present invention.

In a preferred embodiment, the stiffeners to be fabricated upon or positioned upon and secured to a tape or strip of tapes in accordance with the invention are fabricated using precisely focused electromagnetic radiation in the form of an ultraviolet (UV) wavelength laser under control of a computer and responsive to input from a machine vision system, such as a pattern recognition system, to fix or cure selected regions of a layer of a liquid photopolymer material disposed on the semiconductor device or other substrate.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

The accompanying drawings illustrate exemplary embodiments of the invention, wherein some dimensions may be exaggerated for the sake of clarity, and wherein:

FIG. 2 is a top view of an exemplary embodiment of a tape strip including a first configuration of stiffeners according to the present invention, the stiffeners extending adjacent substantially the entire peripheries of the individual tapes of the strip;

FIG. 2A is a top view of the interlinked stiffeners of the tape shown in FIG. 2;

FIG. 3 is a top view schematic representation of an embodiment of a strip of tape including a second configuration of stiffener reinforcing the sprocket or indexing holes of the strip;

FIG. 5A is a top view of a framework of an interlinked plurality of stiffeners having the configuration illustrated in FIG. 5;

DETAILED DESCRIPTION OF THE INVENTION

Stiffeners

Figure 1:
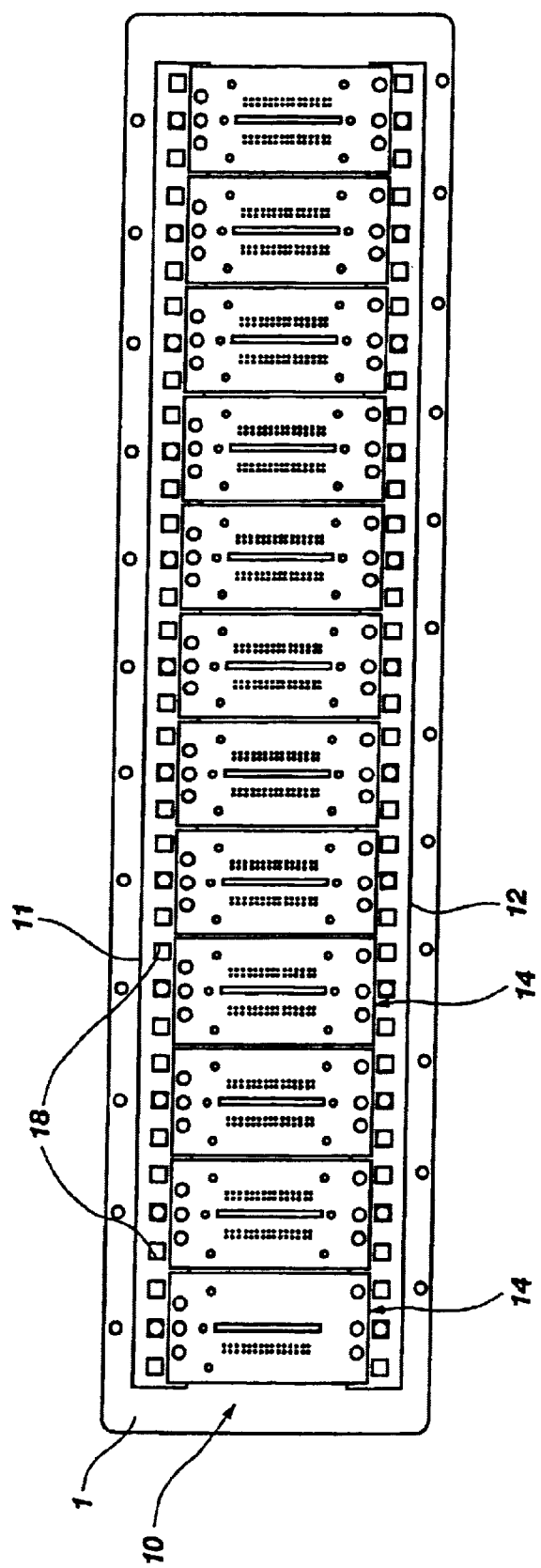
FIG. 1 is a top view of a conventional tape strip with metallic stiffeners secured thereto.

With reference to FIG. 2, a strip 10 of tapes 14 for use in TBGA packages or other TAB applications is illustrated. Each tape 14, which may be a TBGA tape or TAB tape of known configuration, includes electrically conductive circuit traces 15 (see, e.g., FIG. 6) thereon, some of which lead to contact pads positioned on the opposite side of tape 14. Tape 14 also includes apertures 17 to facilitate the formation of electrical connections therethrough. Sprocket or indexing holes 18 are located near the top and bottom edges 11, 12 of strip 10 and are consistently spaced apart from one another along the top and bottom edges 11, 12 of strip 10 so as to facilitate mechanical indexing of strip 10.

A stiffener 20 is secured to each tape 14. Each stiffener 20 shown in FIG. 2 extends adjacent the substantial periphery of the corresponding tape 14. Stiffeners 20 are preferably formed from a rigid dielectric material, such as a photocurable polymer, or photopolymer, to prevent bending or torsional flexion of tape 14. Preferably, stiffeners 20 on adjacent tapes 14 are physically separate from one another in order to permit at least some bending of strip 10. FIG. 2A illustrates the framework 220 formed by an elongated series of interlinked stiffeners 20.

As shown in FIG. 3, stiffeners 20' according to the present invention may also be employed to reinforce sprocket or indexing holes 18 or other apertures 17 through tape 14. As illustrated, stiffeners 20' are elongate members positioned adjacent the top and bottom edges 11, 12 of strip 10. Stiffeners 20' include apertures 22' therethrough, which are aligned with sprocket or indexing holes 18 of each tape 14. Again, stiffeners 20' are preferably formed from a dielectric material, such as a photopolymer. The dielectric material from which stiffeners 20' are formed reinforces sprocket or indexing holes 18 during use thereof to effect the movement of tape 14. Stiffeners 20' on adjacent tapes 14 may be physically separate from one another or extend substantially continuously across the top and bottom edges 11, 12 of strip 10.

Figure 4:
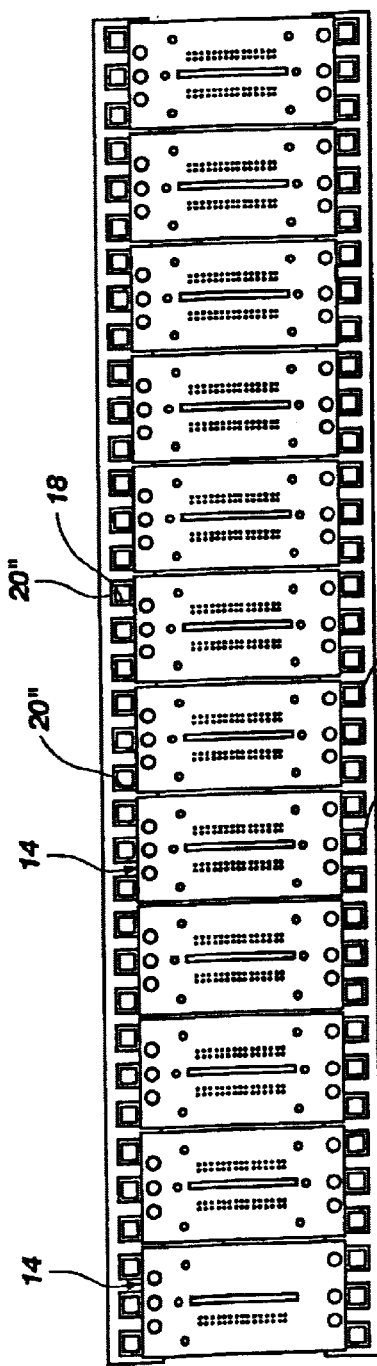
FIG. 4 is a top view schematic representation of a strip of tape including a third configuration of stiffener reinforcing the sprocket or indexing holes of the strip.

FIG. 4 illustrates a variation of stiffeners 20'' that reinforce sprocket or indexing holes 18 of tape 14. Stiffeners 20'' are separate rings or borders that surround the peripheries of and reinforce individual sprocket or indexing holes 18.

Figure 5:
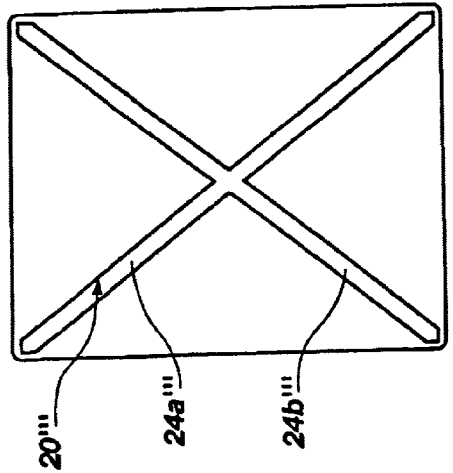
FIG. 5 is a top view schematic representation of a fourth configuration of stiffener, which has an X-shape.

Turning now to FIG. 5, another configuration of stiffener 20''' includes two intersecting members 24a''', 24b''', each of which diagonally traverse tape 14. Members 24a''' and 24b''' intersect at or near the center of tape 14, imparting stiffener 20' with an X-shape. Members 24a''' and 24b''' are preferably connected at the point where they intersect to enhance both torsional and bending support for tape 14. FIG. 5A illustrates the framework 220''' formed by an elongated series of interlined stiffeners 20'''.

Figure 6:
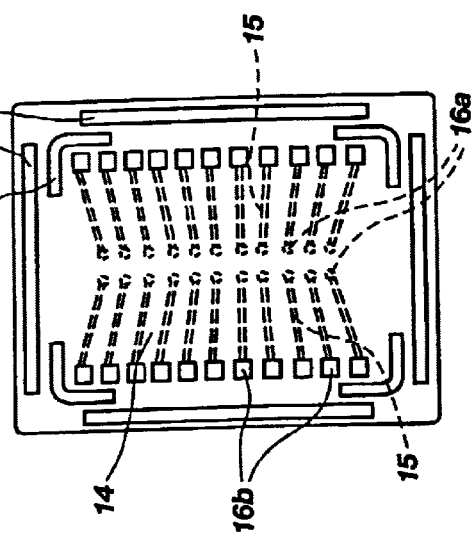
FIG. 6 is a top view schematic representation of a fifth configuration of stiffener, which includes elongate members.

Another configuration of a stiffener 120 incorporating teachings of the present invention is depicted in FIG. 6. As shown, stiffener 120 includes several elongate members 124a, 124b. Elongate members 124a are substantially straight, while elongate members 124b are bent, curved, or otherwise nonlinear. Elongate members 124a, 124b of stiffener 120 are preferably arranged upon tape 14 so as to prevent undesirable torsional flexion or bending of tape 14. When located on the same side of tape 14 as that to which a semiconductor die is to be secured, the stiffener 120 structure depicted in FIG. 6 may also be employed to facilitate alignment of the semiconductor die with tape 14.

FIG. 6 also shows an exemplary arrangement of contact pads 16a, 16b and circuit traces 15 on tape 14. Contact pads 16a, shown in phantom, are located on the side of tape 14 on which a semiconductor die is to be positioned, thereby facilitating connection between bond pads of the semiconductor die and contact pads 16a, as known in the art (e.g., by wire bonding, thermocompression bonding, solder balls, conductive epoxy segments, etc.). Circuit traces 15, which are also illustrated in phantom, may be at least partially carried by tape 14 on one or both surfaces thereof, as well as internally therethrough Circuit traces 15 communicate with contact pads 16a and with contact pads 16b, which may be located on an opposite side of tape 14 from contact pads, 16a and are positioned so as to facilitate electrical connection of tape 14 and, thus, of a semiconductor die connected to tape 14 to a higher level, or carrier, substrate. Alternatively, contact pads 16a and contact pads 16b may be located on the same side of tape 14. Contact pads 16a and 16b are collectively referred to herein as contact pads 16.

Figure 7:
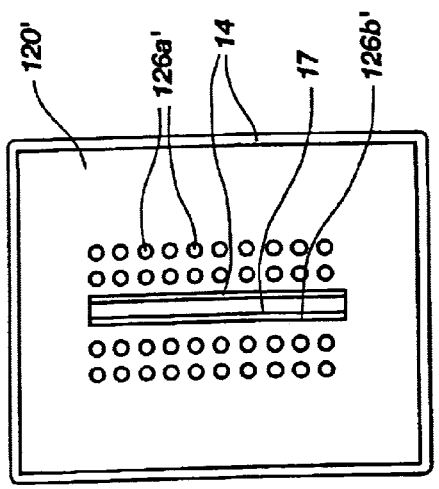
FIG. 7 is a top view schematic representation of a sixth configuration of stiffener, which includes a sheet of material disposed over the tape.

FIG. 7 illustrates yet another configuration of stiffener 120', which includes a sheet of dielectric material, such as a photopolymer, that covers at least a portion of the surface area of tape 14 to thereby support same. Stiffener 120', as well as other embodiments of stiffeners incorporating teachings of the present invention, may also include other apertures 126a', 126b'.

Figure 8:
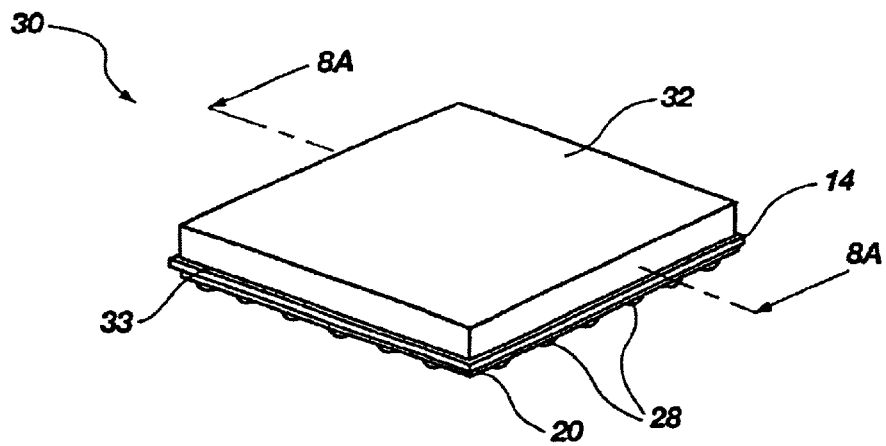
FIG. 8 is a perspective schematic representation of a TBGA package including the ball grid array tape and stiffener depicted in FIG. 2.
Figure 8A:
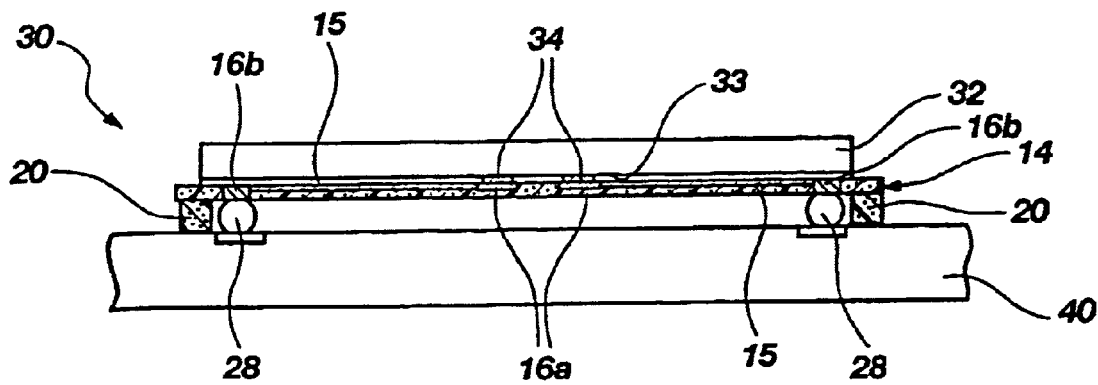
FIGS. 8A and 8B are exemplary cross-sectional representations of the TBGA package of FIG. 8, taken along line 8A—8A, and showing the TBGA packages connected to carrier substrates.
Figure 8B:
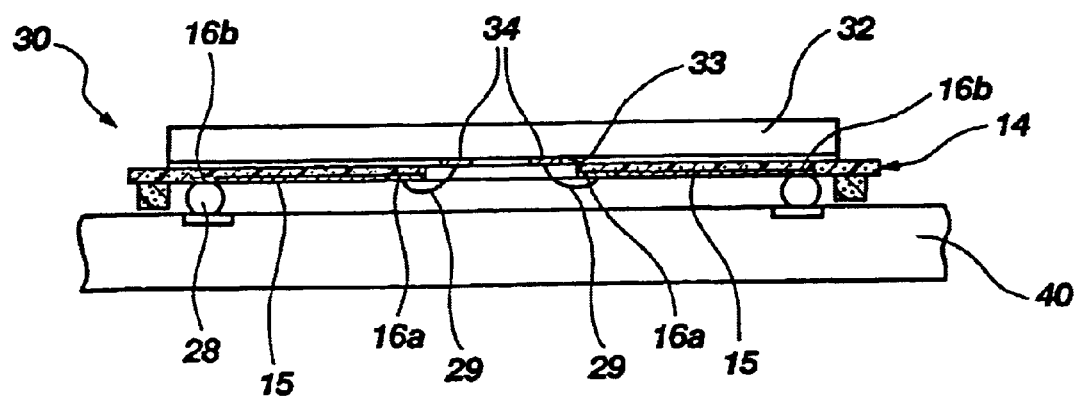

Referring now to FIGS. 8, 8A, and 8B, a TBGA package 30 is illustrated that includes a semiconductor die 32 and a tape 14 secured to an active surface 33 of semiconductor die 32. Contact pads 16b to which conductive structures 28 are secured and the corresponding circuit traces 15 carried by tape 14 are electrically connected, as known in the art (em., by wire bonds, thermocompression bonds, solder balls, conductive epoxy segments, etc.), by way of contact pads 16a to corresponding bond pads 34 on active surface 33 of semiconductor die 32. Stiffener 20, which is secured to an opposite side of tape 14 than semiconductor die 32, is preferably positioned so as not to impede the placement of intermediate conductive elements, such as bond wires 29 (FIG. 8B), conductive structures 28, or thermocompression bonds (FIG. 8A), between tape 14 and semiconductor die 32. As shown in FIGS. 8A and 8B, intermediate conductive elements, such as the illustrated conductive structures 28, conductive epoxy segments, or a conductive material-filled epoxy structure, electrically connect TBGA package 30 to a carrier substrate 40.

Figure 9:
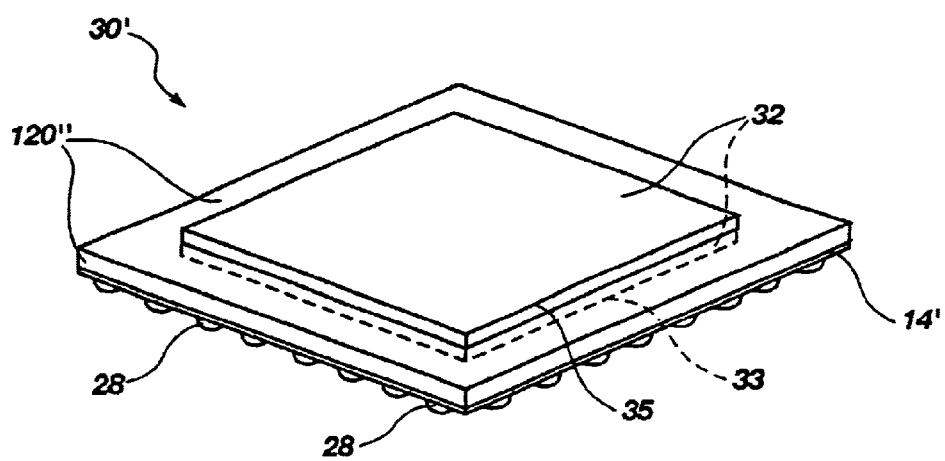
FIG. 9 is a perspective schematic representation of another TBGA package including a tape with a stiffener that extends beyond the periphery of the die of the TBGA package.

Another embodiment of a TBGA package 30', depicted in FIG. 9, includes a semiconductor die 32 and a tape 14' having a greater surface area than that of an active surface 33 of semiconductor die 32 to which tape 14' is secured. Thus, tape 14' extends beyond an outer periphery 35 of semiconductor die 32. As illustrated, TBGA package 30' includes conductive structures 28 (e.g., solder bumps or balls) located beyond outer periphery 35 and, thus, tape 14' also includes circuit traces 15 (see, e.g., FIG. 6) that extend beyond outer periphery 35 of semiconductor die 32 and contact pads 16 (see, e.g., FIG. 6) that are located outside outer periphery 35. Tape 14' has s thereto a stiffener 120" that supports,the portions thereof that extend laterally beyond outer periphery 35. As shown in FIG. 9, stiffener 120" is located on the same side of tape 14' as semiconductor die 32 and does not, therefore, add significantly to the overall thickness of TBGA package 30'. Alternatively, stiffener 120" may be positioned on the opposite side of tape 14' from semiconductor die 32. A stiffener 120" that is positioned on the opposite side of tape 14' from semiconductor die 32 may also traverse tape 14' opposite semiconductor die 32 to provide additional support to TBGA package 30'.

Figure 10:
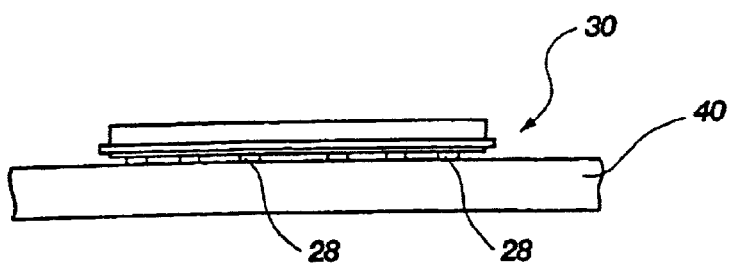
FIG. 10 is a side view schematic representation of the TBGA package of FIG. 8 connected face-down to a carrier substrate.

FIG. 10 illustrates an assembly including TOGA package 30 connected in face-down orientation, or flip-chip bonded, to a carrier substrate 40, as known in the art.

While a plurality of stiffeners incorporating teachings of the present invention (e.g., stiffeners 20, 20', 20''', 20''', 120, 120', and 120'', which are collectively referred to hereinafter as stiffeners 20) are preferably substantially simultaneously fabricated on or secured to a collection of tapes 14, such as on a strip 10 of tapes 14, stiffeners 20 according to the present invention may also be fabricated on or secured to a collection of individual or connected tapes 14, or to individual tapes 14. Alternatively, stiffeners 20 may be substantially simultaneously fabricated on or secured to a collection of more than one type of tape 14. As another alternative, different types of stiffeners 20 may be substantially simultaneously fabricated on different tapes 14.

Stiffeners 20 may be fabricated directly on tapes 14 or fabricated separately from tapes 14, then secured thereto as known in the art, such as by the use of a suitable adhesive.

As indicated previously herein, stiffeners 20 are preferably fabricated from a dielectric photopolymer. Stereolithographic processes are preferably used to fabricate stiffeners 20. Thus, each stiffener 20 may include a single layer of at least partially cured photopolymer or a plurality of superimposed, contiguous, mutually adhered layers of photopolymer.

Stereolithography Apparatus and Methods

Figure 11:
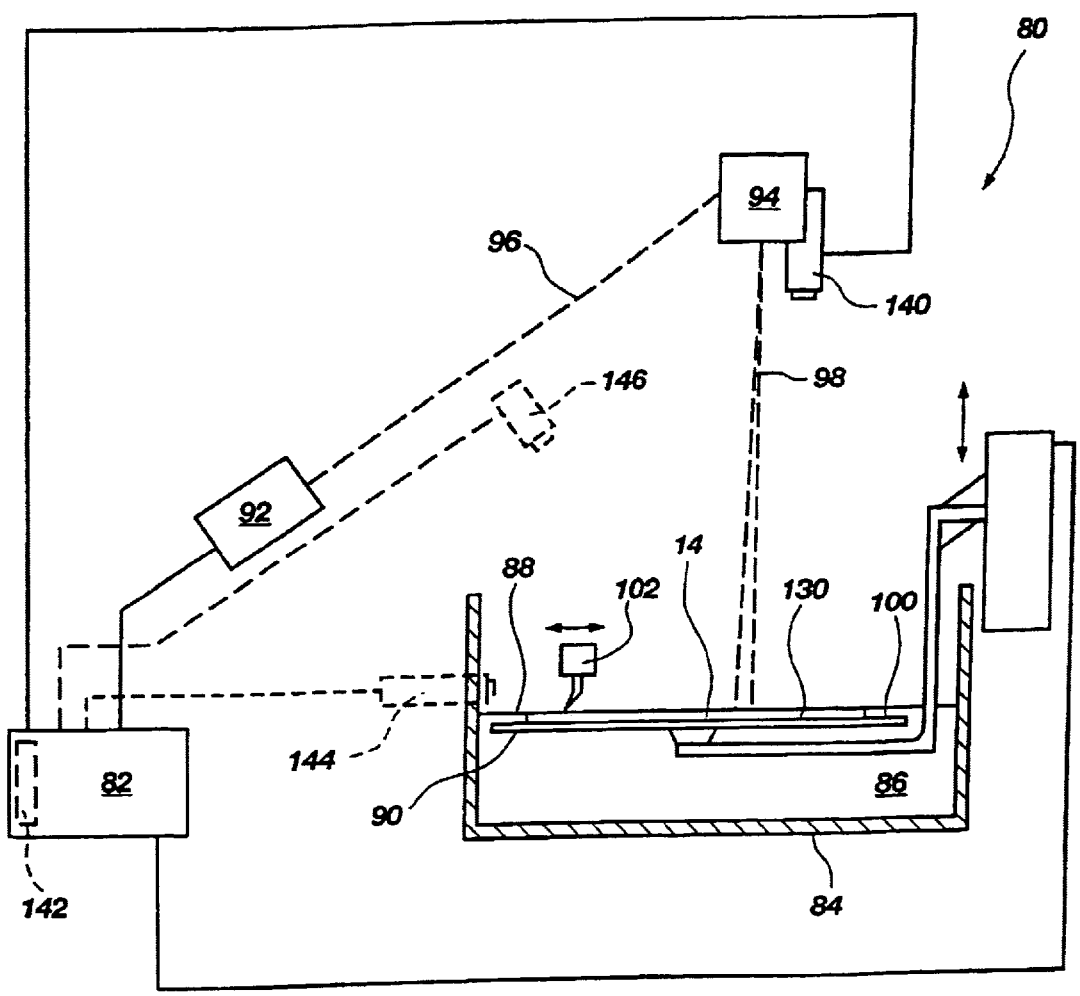
FIG. 11 is a schematic representation of an exemplary stereolithography apparatus that may be employed in the method of the present invention to fabricate the stiffeners of the present invention.

FIG. 11 schematically depicts various components, and operation, of an exemplary-stereolithography apparatus 80 to facilitate the reader's understanding of the technology employed in implementation of the method of the present invention, although those of ordinary sill in the art will understand and appreciate that apparatus of other designs and manufacture may be employed in practicing the method of the present invention. The preferred, basic stereolithography apparatus for implementation of the method of the present invention, as well as operation of such apparatus, are described in great detail in United States Patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328;,5, 501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by this reference.

With continued reference to FIG. 11 and as noted above, a 3-D CAD drawing of an object to be fabricated in the form of a data file is placed in the memory of a computer 82 controlling the operation of apparatus 80 if computer 82 is not a CAD computer in which the original object design is effected. In other words, an object design may be effected in a first computer in an engineering or research facility and the data files transferred via wide or local area network, tape, disc, CD-ROM, or otherwise as known in the art to computer 82 of apparatus 80 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so translation from another internal geometric database format is often unnecessary. In an STL file, the boundary surfaces of an object are defined as a mesh of interconnected triangles.

Apparatus 80 also includes a reservoir 84 (which may comprise a removable reservoir interchangeable with others containing different materials) of an unconsolidated material 86 to be employed in fabricating the intended object. In the currently preferred embodiment, the unconsolidated material 86 is a liquid, photocurable polymer, or "photopolymer," that cures in response to light in the UV wavelength range. The surface level 88 of unconsolidated material 86 is automatically maintained at an extremely precise, constant magnitude by devices known in the art responsive to output of sensors within apparatus 80 and preferably under control of computer 82. A support platform or elevator 90, precisely vertically movable in fine, repeatable increments responsive to control of computer 82, is located for movement downward into and upward out of material 86 in reservoir 84.

Figure 12:
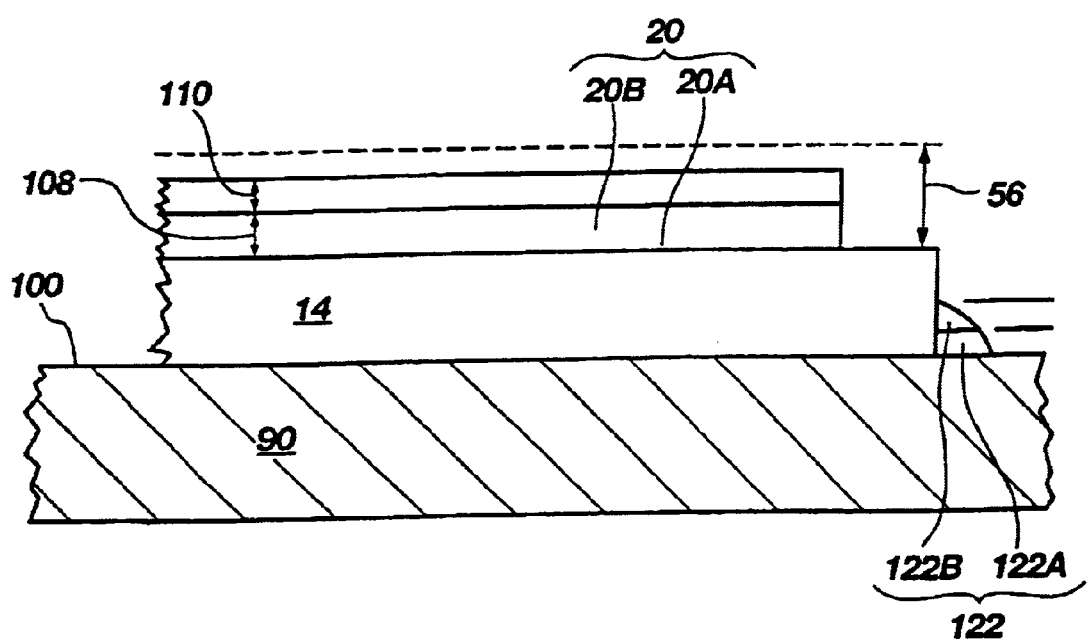
FIG. 12 is a partial cross-sectional side view of a tape disposed on a platform of a stereolithographic apparatus for the formation of a stiffener on the tape.

An object may be fabricated directly on platform 90, or on a substrate disposed on platform 90. When the object is to be fabricated on a substrate disposed on platform 90, the substrate may be positioned on platform 90 and secured thereto by way of one or more base supports 122 (FIG. 12). Such base supports 122 maybe fabricated before or simultaneously with the stereolithographic fabrication of one or more objects on platform 90 or a substrate disposed thereon. These supports 122 may support, or prevent lateral movement of, the substrate relative to a surface 100 of platform 90. Supports 122 may also provide a perfectly horizontal reference plane for fabrication of one or more objects thereon, as well as facilitate the removal of a substrate from platform 90 following the stereolithographic fabrication of one or more objects on the substrate. Moreover, where a so-called "recoater" blade 102 is employed to form a layer of material on platform 90 or a substrate disposed thereon, supports 122 may preclude inadvertent contact of recoater blade 102, to be described in greater detail below, with surface 100 of platform 90.

Apparatus 80 has a UV wavelength range laser plus associated optics and galvanometers (collectively identified as laser 92) for controlling the scan of laser beam 96 in the X-Y plane across platform 90. Laser 92 has associated therewith a mirror 94 to reflect laser beam 96 downwardly as laser beam 98 toward surface 100 of platform 90. Laser beam 98 is traversed in a selected pattern in the X-Y plane, that is to say, in a plane parallel to surface 100, by initiation of the galvanometers under control of computer 82 to at least partially cure, by impingement thereon, selected portions of material 86 disposed over surface 100 to at least a partially consolidated (e.g., semisolid) state. The use of mirror 94 lengthens the path of the laser beam, effectively doubling same, and provides a more vertical laser beam 98 than would be possible if the laser 92 itself were mounted directly above platform surface 100, thus enhancing resolution.

Referring now to FIGS. 11 and 12, data from the STL files resident in computer 82 is manipulated to build an object, such as a stiffener 20, various configurations of which are illustrated in FIGS. 1–10, or base supports 122, one layer at a time. Accordingly, the data mathematically representing one or more of the objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.0001 to about 0.0300 inch thick. As mentioned previously, a thinner slice promotes higher resolution by enabling better reproduction of fine vertical surface features of the object or objects to be fabricated.

When one or more base supports 122 are to be stereolithographically fabricated, supports 122 may be programmed as a separate STL file from the other objects to be fabricated. The primary STL file for the object or objects to be fabricated and the STL file for base support(s) 122 are merged.

Before fabrication of a first layer for a support 122 or an object to be fabricated is commenced, the operational parameters for apparatus 80 are set to adjust the size (diameter if circular) of the laser light beam used to cure material 86. In addition, computer 82 automatically checks and, if necessary, adjusts by means known in the art the surface level 88 of material 86 in reservoir 84 to maintain same at an appropriate focal length for laser beam 98. U.S. Pat. No. 5,174,931, referenced above and previously incorporated herein by reference, discloses one suitable level control system. Alternatively, the height of mirror 94 may be adjusted responsive to a detected surface level 88 to cause the focal point of laser beam 98 to be located precisely at the surface of material 86 at surface level 88 if level 88 is permitted to vary, although this approach is more complex. Platform 90 may then be submerged in material 86 in reservoir 84 to a depth equal to the thickness of one layer or slice of the object to be formed, and the liquid surface level 88 is readjusted as required to accommodate material 86 displaced by submergence of platform 90. Laser 92 is then activated so laser beam 98 will scan unconsolidated (e.g., liquid or powdered) material 86 disposed over surface 100 of platform 90 to at least partially consolidate (e.g., polymerize to at least a semisolid state) material 86 at selected locations, defining the boundaries of a first layer 122A of base support 122 and filling in solid portions thereof Platform 90 is then lowered by a distance equal to the thickness of second layer 122B, and laser beam 98 scanned over selected regions of the surface of material 86 to define and fill in the second layer while simultaneously bonding the second layer to the first. The process may then be repeated, as often as necessary, layer by layer, until base support 122 is completed. Platform 90 is then moved relative to mirror 94 to form any additional base supports 122 on platform 90 or a substrate disposed thereon or to fabricate objects upon platform 90, base support 122, or a substrate, as provided in the control software. The number of layers required to erect support 122 or one or more other objects to be formed depends upon the height of the object or objects to be formed and the desired layer thickness 108, 110. The layers of a stereolithographically fabricated structure with a plurality of layers may have different thicknesses.

If a recoater blade 102 is employed, the process sequence is somewhat different. In this instance surface 100 of platform 90 is lowered into unconsolidated (e.g., liquid) material 86 below surface level 88 a distance greater than a thickness of a single layer of material 86 to be cured, then raised above surface level 88 until platform 90, a substrate disposed thereon, or a structure being formed on platform 90 or a substrate thereon is precisely one layer's thickness below blade 102. Blade 102 then sweeps horizontally over platform 90 or (to save time) at least over a portion thereof on which one or more objects are to be fabricated to remove excess material 86 and leave a film of precisely the desired thickness. Platform 90 is then lowered so that the surface of the film and surface level 88 are coplanar and the surface of the unconsolidated material 86 is still. Laser 92 is then initiated to scan with laser beam 98 and define the first layer 130. The process is repeated, layer by layer, to define each succeeding layer 130 and simultaneously bond same to the next-lower layer 130 until all of the layers of the object or objects to be fabricated are completed. A more detailed discussion of this sequence and apparatus for performing same is disclosed in U.S. Pat. No. 5,174,931, previously incorporated herein by reference.

As an alternative to the above approach to preparing a layer of material 86 for scanning with laser beam 98, a layer of unconsolidated (e.g., liquid) material 86 may be formed on surface 100 of support platform 90, on a substrate disposed on platform 90, or on one or more objects being fabricated by lowering platform 90 to flood material 86 over surface 100, over a substrate disposed thereon, or over the highest completed layer of the object or objects being formed, then raising platform 90 and horizontally traversing a so-called "meniscus" blade over platform 90 to form a layer of unconsolidated material having the desired thickness over platform 90, the substrate, or each of the objects being formed. Laser 92 is then initiated and a laser beam 98 scanned over the layer of unconsolidated material to define at least the boundaries of the solid regions of the next-higher layer of the object or objects being fabricated.

Yet another alternative to layer preparation of unconsolidated (e.g., liquid) material 86 is to merely lower platform 90 to a depth equal to that of a layer of material 86 to be scanned, and to then traverse a combination flood bar and meniscus bar assembly horizontally over platform 90, a substrate disposed on platform 90, or one or more objects being formed to substantially concurrently flood material 86 thereover and to define a precise layer thickness of material 86 for scanning.

All of the foregoing approaches to liquid material flooding and layer definition and apparatus for initiation thereof are known in the art and are not material to practice of the present invention, so no further details relating thereto will be provided herein.

In practicing the present invention, a commercially available stereolithogrwhy apparatus operating generally in the manner as that described above with respect to apparatus 80 of FIG. 11 is preferably employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc., of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and 7000 systems, and Cibatool SL 7510 resin for the SLA-7000 system. All of these photopolymers are available from Ciba Specialty Chemicals Inc. of Bezel, Switzerland.

By way of example and not limitation, the layer thickness of material 86 to be formed, for purposes of the invention, may be on the order of about 0.0001 to 0.0300 inch, with a high degree of uniformity. It should be noted that different material layers may have different heights, so as to form a structure of a precise, intended total height or to provide different material thicknesses for different portions of the structure. The size of the laser beam "spot" impinging on the surface of material 86 to cure same may be on the order of 0.001 inch to 0.008 inch. Resolution is preferably ±0.0003 inch in the X-Y plane (parallel to surface 100) over at least a 0.5 inch×0.25 inch field from a center point, permitting a high resolution scan effectively across a 1.0 inch×0.5 inch area Of course, it is desirable to have substantially this high a resolution across the entirety of surface 100 of platform 90 to be scanned by laser beam 98, such area being termed the "field of exposure," such area being substantially coextensive with the vision field of a machine vision system employed in the apparatus of the invention as explained in more detail below. The longer and more effectively vertical the path of laser beam 96/98, the greater the achievable resolution.

Referring again to FIG. 11, it should be noted that apparatus 80 useful in the method of the present invention includes a camera 140 which is in communication with computer 82 and preferably located, as shown, in close proximity to mirror 94 located above surface 100 of support platform 90. Camera 140 may be any one of a number of commercially available cameras, such as capacitive-coupled discharge (CCD) cameras available from a number of vendors. Suitable circuitry as required for adapting the output of camera 140 for use by computer 82 may be incorporated in a board 142 installed in computer 82, which is programmed as known in the art to respond to images generated by camera 140 and processed by board 142. Camera 140 and board 142 may together comprise a so-called "machine vision system" and, specifically, a "pattern recognition system" (PRS), the operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated herein by this reference.

Stereolithographic Fabrication of the Stiffeners

In order to facilitate fabrication of one or more stiffeners 20 in accordance with the method of the present invention with apparatus 80, a data file representative of the size, configuration, thickness and surface topography of, for example, a particular type and design of tape 14 upon which one or more stiffeners 20 are to be mounted is placed in the memory of computer 82. Also, if it is desired that the stiffeners 20 be so positioned on tape 14 taking into consideration features of a higher-level substrate 40 (see FIG. 10) to which a semiconductor device assembly including tape 14 is to be connected, a data file representative of substrate 40 and the features thereof may be placed in memory.

One or more tapes 14 may be placed on surface 100 of platform 90 for fabrication of stiffeners 20 thereon. If one or more tapes 14 are to be held on or above support platform 90 by stereolithographically formed base supports 122, one or more layers of material 86 are sequentially disposed on surface 100 and selectively altered by use of laser 92 to form base supports 122.

Camera 140 is then activated to locate the position and orientation of each tape 14 upon which stiffeners 20 are to be fabricated. The features of each tape 14 are compared with those in the data file residing in memory, the locational and orientational data for each tape 14 then also being stored in memory. It should be noted that the data file representing the design size, shape and topography for each tape 14 may be used at this juncture to detect physically defective or damaged tapes 14 prior to fabricating stiffeners 20 thereon or before conducting further processing or assembly of tapes 14 with other semiconductor device components. Accordingly, such damaged or defective tapes 14 may be deleted from the process of fabricating stiffeners 20, from further processing, or from assembly with other components. It should also be noted that data files for more than one type (size, thickness, configuration, surface topography) of each tape 14 may be placed in computer memory and computer 82 programmed to recognize not only the locations and orientations of each tape 14, but also the type of tape 14 at each location upon platform 90 so that material 86 may be at least partially consolidated by laser beam 98 in the correct pattern and to the height required to define stiffeners 20 in the appropriate, desired locations on each tape 14.

Continuing with reference to FIGS. 11 and 12, the one or more tapes 14 on platform 90 may then be submerged partially below the surface level 88 of unconsolidated material 86 to a depth greater than the thickness of a first layer of material 86 to be at least partially consolidated (e.g., cured to at least a semisolid state) to form the lowest layer 130 of each stiffener 20 at the appropriate location or locations on each tape 14 or other substrate, then raised to a depth equal to the layer thickness, the surface of material 86 being allowed to become calm. Photopolymers that are useful as material 86 exhibit a desirable dielectric constant, exhibit low shrinkage upon cure, are of sufficient (i.e., semiconductor grade) purity, exhibit good adherence to other semiconductor device materials, and have a coefficient of thermal expansion (CTE) similar to the material of tape 14. Preferably, the CTE of material 86 is sufficiently similar to that of tape 14 to prevent undue stressing thereof during thermal cycling of a semiconductor device including tape 14 in testing, subsequent processing, and subsequent normal operation. Exemplary photopolymers exhibiting these properties are believed to include, but are not limited to, the above-referenced resins from Ciba Specialty Chemicals Inc. One area of particular concern is determining resin suitability is the substantial absence of mobile ions, and specifically fluorides.

Laser 92 is then activated and scanned to direct laser beam 98, under control of computer 82, toward specific locations of surface level 88 relative to each tape 14 to effect the aforementioned partial cure of material 86 to form a first layer 20A of each stiffener 20. Platform 90 is then lowered into reservoir 84 and raised a distance equal to the desired thickness of another layer 20B of each stiffener 20, and laser 92 is activated to add another layer 20B to each stiffener 20 under construction. This sequence continues, layer by layer, until each of the layers of each stiffener 20 has been completed.

In FIG. 12, the first layer of stiffener 20 is identified by numeral 20A, and the second layer is identified by numeral 20B. Likewise, the first layer of base support 122 is identified by numeral 122A and the second layer thereof is identified by numeral 122B. As illustrated, both base support 122 and stiffener 20 have only two layers. Stiffeners 20 with any number of layers are, however, within the scope of the present invention. The use of a large number of layers may be employed to substantially simulate the curvature of a solder ball to be encompassed thereby.

Each layer 20A, 20B of stiffener 20 is preferably built by first defining any internal and external object boundaries of that layer with laser beam 98, then hatching solid areas of stiffener 20 located within the object boundaries with laser beam 98. An internal boundary of a layer may comprise an aperture, a through-hole, a void, or a recess in stiffener 20, for example. If a particular layer includes a boundary of a void in the object above or below that layer, then laser beam 98 is scanned in a series of closely spaced, parallel vectors so as to develop a continuous surface, or skin, with improved strength and resolution. The time it takes to form each layer depends upon the geometry thereof the surface tension and viscosity of material 86, and the thickness of that layer.

Alternatively, stiffeners 20 may each be formed as a partially cured outer skin extending above a surface of tape 14 and forming a dam within which unconsolidated material 86 may be contained. This may be particularly useful where the stiffeners 20 protrude a relatively high distance 56 from the surface of tape 14. In this instance, support platform 90 maybe submerged so that material 86 enters the area within the dam, raised above surface level 88, and then laser beam 98 activated and scanned to at least partially cure material 86 residing within the dam or, alternatively, to merely cure a "skin" comprising the contact s a final cure of the material of the stiffeners 20 being effected subsequently by broad-source UV radiation in a chamber, or by thermal cure in an oven In this manner, stiffeners 20 of extremely precise dimensions may be formed of material 86 by apparatus 80 in minimal time.

Once stiffeners 20, or at least the outer skins thereof, have been fabricated, platform 90 is elevated above surface level 88 of material 86 and platform 90 is removed from apparatus 80, along with any substrate (e.g., tape 14) disposed thereon and any sterolithographically fabricated structures, such as stiffeners 20. Excess, unconsolidated material 86 (e.g., excess uncured liquid) may be manually removed from platform 90, from any substrate disposed thereon, and from stiffeners 20. Each tape 14 is removed from platform 90, such as by cutting the substrate free of base supports 122. Alternatively, base supports 122 may be configured to readily release each tape 14. As another alternative, a solvent may be employed to release base supports 122 from platform 90. Such release and solvent materials are known in the art. See, for example, U.S. Pat. No. 5,447,822 referenced above and previously incorporated herein by reference.

Stiffeners 20 and tapes 14 may also be cleaned by use of known solvents that will not substantially degrade, deform, or damage stiffeners 20 or tapes 14 to which stiffeners 20 are secured.

As noted previously, stiffeners 20 may then require post-curing. Stiffeners 20 may have regions of unconsolidated material contained within a boundary or skin thereof, or material 86 may be only partially consolidated (e.g., polinerized or cured) and exhibit only a portion (typically 40% to 60%) of its fully consolidated strength Postcuring to completely harden stiffeners 20 may be effected in another apparatus projecting UV radiation in a continuous manner over stiffeners 20 or by thermal completion of the initial, UV-initiated partial cure.

It should be noted that the height, shape, or placement of each stiffener 20 on each specific tape 14 may vary, again responsive to output of camera 140 or one or more additional cameras 144 or 146, shown in broken lines, detecting the protrusion of unusually high (or low) preplaced solder balls which could affect the desired distance 56 that stiffeners 20 will protrude from the surface of tape 14. In any case, laser 92 is again activated to at least partially cure material 86 residing on each tape 14 to form the layer or layers of each stiffener 20.

Although FIGS. 11 and 12 illustrate the stereolithographic fabrication of stiffeners 20 on a substrate, such as a tape 14, stiffeners 20 may be fabricated separately from a substrate, then secured to the substrate by known processes, such as by the use of a suitable adhesive material.

The use of a stereolithographic process as exemplified above to fabricate stiffeners 20 is particularly advantageous since a large number of stiffeners 20 may be fabricated in a short period of time, the stiffener height and position are computer controlled to be extremely precise, wastage of unconsolidated material 86 is minimal, solder coverage of passivation materials is avoided, and the stereolithography method requires minimal handling of tape 14.

Stereolithography is also an advantageous method of fabricating stiffeners 20 according to the present invention since stereolithography may be conducted at substantially ambient temperature, the small spot size and rapid traverse of laser beam 98 resulting in negligible thermal stress upon tape 14 or on the circuit traces 15 or contact pads 16 thereof.

The stereolithography fabrication process may also advantageously be conducted at the wafer level or on multiple substrates, saving fabrication time and expense. As the stereolithography method of the present invention recognizes specific types of tape 14, variations between individual tapes 14 are accommodated. Accordingly, when the stereolithography method of the present invention is employed, stiffeners 20 may be simultaneously fabricated on different types of tape 14.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method for fabricating at least one nonconductive stiffener for a connective structure to be used in tape-automated bonding, comprising: stereolithographically forming at least a portion of at least one element of the at least one nonconductive stiffener.

2. The method of claim 1, wherein stereolithographically forming comprises at least partially consolidating material in selected regions of at least one layer of substantially unconsolidated material.

3. The method of claim 1, wherein stereolithographically forming is effected over at least one connective structure.

4. The method of claim 3, wherein stereolithographically forming is effected over a plurality of connective structures.

5. The method of claim 4, wherein stereolithographically forming is effected over a strip including the plurality of connective structures.

6. The method of claim 3, wherein stereolithographically forming comprises at least partially consolidating-material located around peripheries of sprocket holes of the at least one connective structure.

7. The method of claim 2, wherein stereolithographically forming comprises disposing at least one layer of substantially unconsolidated photopolymer over a platform.

8. The method of claim 7, wherein stereolithographically forming comprises directing UV radiation onto at least some of the selected regions.

9. The method of claim 1, wherein stereolithographically forming is effected a plurality of times to form at least two superimposed, contiguous, mutually adhered layers of at least the portion of the at least one element of the at least one nonconductive stiffener.

10. The method of claim 1, wherein stereolithographically forming comprises at least partially consolidating peripheries of solid regions of at least the portions of the at least one element.

11. The method of claim 2, further comprising further consolidating partially consolidated material of the at least one nonconductive stiffener.

12. The method of claim 1, further comprising securing the at least one nonconductive stiffener to at least one connective structure.

13. The method of claim 12, wherein securing is effected following sterolithographically forming.

14. A method for fabricating at least one element of a stiffener for a connective structure to be tape-automated bonded to semiconductor device component, comprising sterolithographically forming at least one layer of the stiffener.

15. The method of claim 14, wherein stereolithographically forming comprises forming the at least one layer from a photopolymer.

16. The method of claim 14, wherein stereolithographically forming is effected on the connective structure.

17. The method of claim 14, wherein stereolithographically forming is effected on a strip comprising a plurality of connective structures to be tape-automated bonded to semiconductor device components.

* * * * *

UNITED STATES PATENT AND TRADEMARK OFFICE
CERTIFICATE OF CORRECTION

PATENT NO. : 6,746,899 B2  Page 1 of 1
APPLICATION NO. : 10/436939
DATED : June 8, 2004
INVENTOR(S) : Ford B. Grigg It is certified that error appears in the above-identified patent and that said Letters Patent is hereby corrected as shown below:

In the claims:

CLAIM 6, COLUMN 16, LINE 19, change "consolidating-material" to --consolidating material--

CLAIM 10, COLUMN 16, LINE 35, change "portions" to --portion--

Signed and Sealed this

Fifth Day of September, 2006

JON W. DUDAS
*Director of the United States Patent and Trademark Office*